United States Patent
Pal

(10) Patent No.: US 9,257,886 B2
(45) Date of Patent: Feb. 9, 2016

(54) ROTATING RECTIFIER ASSEMBLY BUS BAR

(75) Inventor: Debabrata Pal, Hoffman Estates, IL (US)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 447 days.

(21) Appl. No.: 13/471,522

(22) Filed: May 15, 2012

(65) Prior Publication Data

US 2013/0308291 A1 Nov. 21, 2013

(51) Int. Cl.
| | |
|---|---|
| H01G 2/00 | (2006.01) |
| H01R 9/00 | (2006.01) |
| H05K 7/00 | (2006.01) |
| H02K 11/00 | (2006.01) |
| H01L 21/00 | (2006.01) |
| H02K 11/04 | (2006.01) |
| H02K 29/00 | (2006.01) |
| H05K 7/02 | (2006.01) |
| H01L 21/58 | (2006.01) |
| H02M 7/06 | (2006.01) |

(52) U.S. Cl.
CPC .............. *H02K 11/042* (2013.01); *H02K 11/04* (2013.01); *H02K 11/044* (2013.01); *H02K 11/046* (2013.01); *H02K 11/048* (2013.01); *H02K 29/00* (2013.01); *H05K 7/02* (2013.01); *H01L 21/58* (2013.01); *H02K 11/00* (2013.01); *H02M 7/06* (2013.01)

(58) Field of Classification Search
CPC ........ H01L 21/58; H01L 29/00; H02K 11/00; H02K 11/04; H02K 11/042; H02K 11/044; H02K 11/046; H02K 11/048; H05K 7/02
USPC ...................... 361/775, 820, 272; 310/68, 71; 29/25.02
See application file for complete search history.

(56) References Cited

U.S. PATENT DOCUMENTS

| | | | |
|---|---|---|---|
| 5,065,484 | A | 11/1991 | Pinchott |
| 5,191,248 | A | 3/1993 | Huss |
| 5,587,616 | A | 12/1996 | Johnsen |
| 6,084,764 | A | 7/2000 | Anderson |
| 6,449,082 | B1 | 9/2002 | Agrawal et al. |
| 6,476,603 | B2 | 11/2002 | Clark et al. |
| 6,761,808 | B1 | 7/2004 | Revill et al. |
| 7,868,494 | B2 * | 1/2011 | Grosskopf et al. .......... 310/68 D |
| 8,029,323 | B2 | 10/2011 | Wavering |
| 2006/0192447 | A1 * | 8/2006 | Bradfield ........................ 310/71 |
| 2010/0284836 | A1 | 11/2010 | Grosskopf et al. |
| 2011/0062807 | A1 | 3/2011 | Berry |

* cited by examiner

*Primary Examiner* — Courtney Smith
*Assistant Examiner* — Zhengfu Feng
(74) *Attorney, Agent, or Firm* — Carlson, Gaskey & Olds, P.C.

(57) ABSTRACT

A rectifier assembly includes a diode pack. A bus bar includes a first layer electrically connected to the diode pack. The first layer has a first yield strength and a first coefficient of thermal expansion. A second layer of copper is joined to the first layer and includes a second yield strength less than the first yield strength. In one example, the second layer has a second coefficient of thermal expansion within 5% of the first coefficient of thermal expansion.

15 Claims, 4 Drawing Sheets

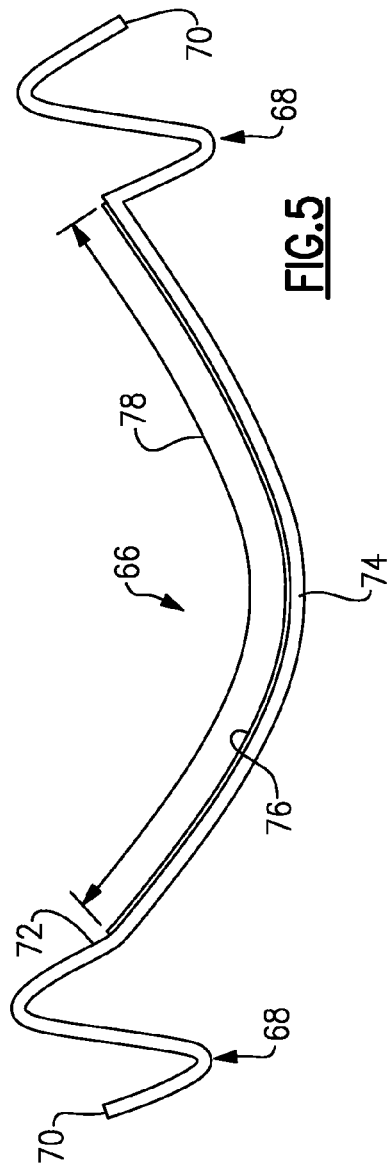
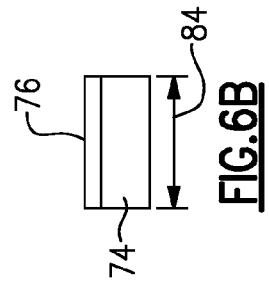
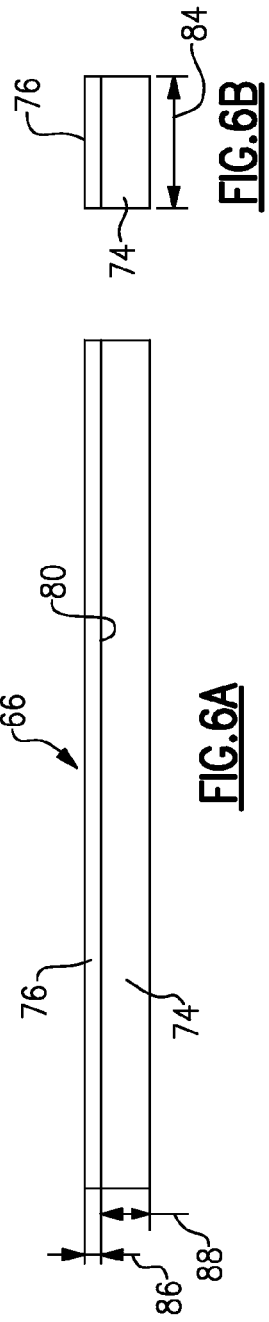
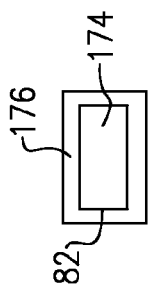
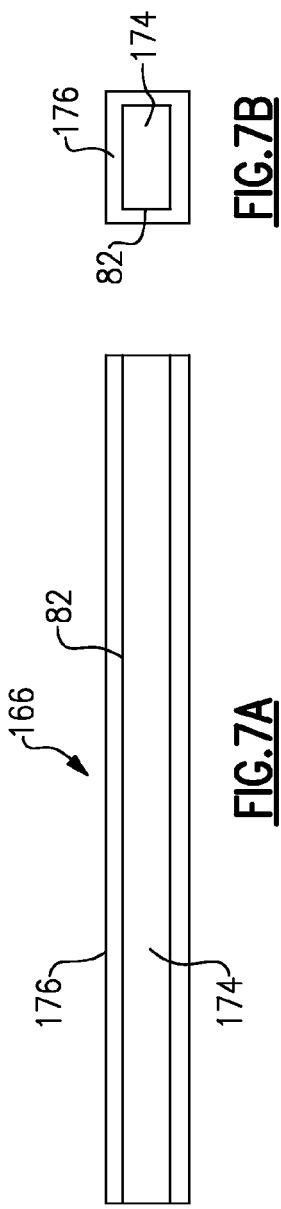

ROTATING RECTIFIER ASSEMBLY BUS BAR

BACKGROUND

This disclosure relates to a generator rotor and its rotor circuit. More particularly, the disclosure relates to a bus bar and rectifier assembly.

A generator includes a stator fixed relative to a housing and a rotor rotatable about an axis relative to the stator. The rotor includes a rotor frame carrying a rotor circuit that includes field turns and a rectifier assembly, which has diodes. Rotation of the rotor relative to the stator induces an alternating current in the field turns, which is converted to a DC voltage by the rectifier assembly.

The rectifier assembly includes an exciter housing that supports multiple circumferentially spaced crescents. Each crescent supports a diode pack connected to a bus bar. The diode packs are cooled by a spray of oil, and the bus bars are cooled by conduction to the diode packs. The bus bars extend circumferentially within the exciter housing. The bus bars are constructed from copper and occasionally break over time due to centrifugal forces, vibration and thermal cycling, resulting in fatigue and breakage of the copper material.

SUMMARY

In one exemplary embodiment, a rectifier assembly includes a diode pack. A bus bar includes a first layer electrically connected to the diode pack. The first layer has a first yield strength and a first coefficient of thermal expansion. A second layer of copper is joined to the first layer and includes a second yield strength less than the first yield strength.

In another exemplary embodiment, a bus bar includes a bus bar having a first layer electrically connected to the diode pack. The first layer has a first yield strength and a first coefficient of thermal expansion. A second layer is joined to the first layer and includes a second yield strength less than the first yield strength and a second coefficient of thermal expansion within 5% of the first coefficient of thermal expansion.

BRIEF DESCRIPTION OF THE DRAWINGS

The disclosure can be further understood by reference to the following detailed description when considered in connection with the accompanying drawings wherein:

FIG. 5 is an elevational view of one example reinforced bus bar.

FIGS. 6A and 6B are respectively side and end views of one example reinforced bus bar.

FIGS. 7A and 7B are respectively side and end views of another example reinforced bus bar.

DETAILED DESCRIPTION

Figure 1:
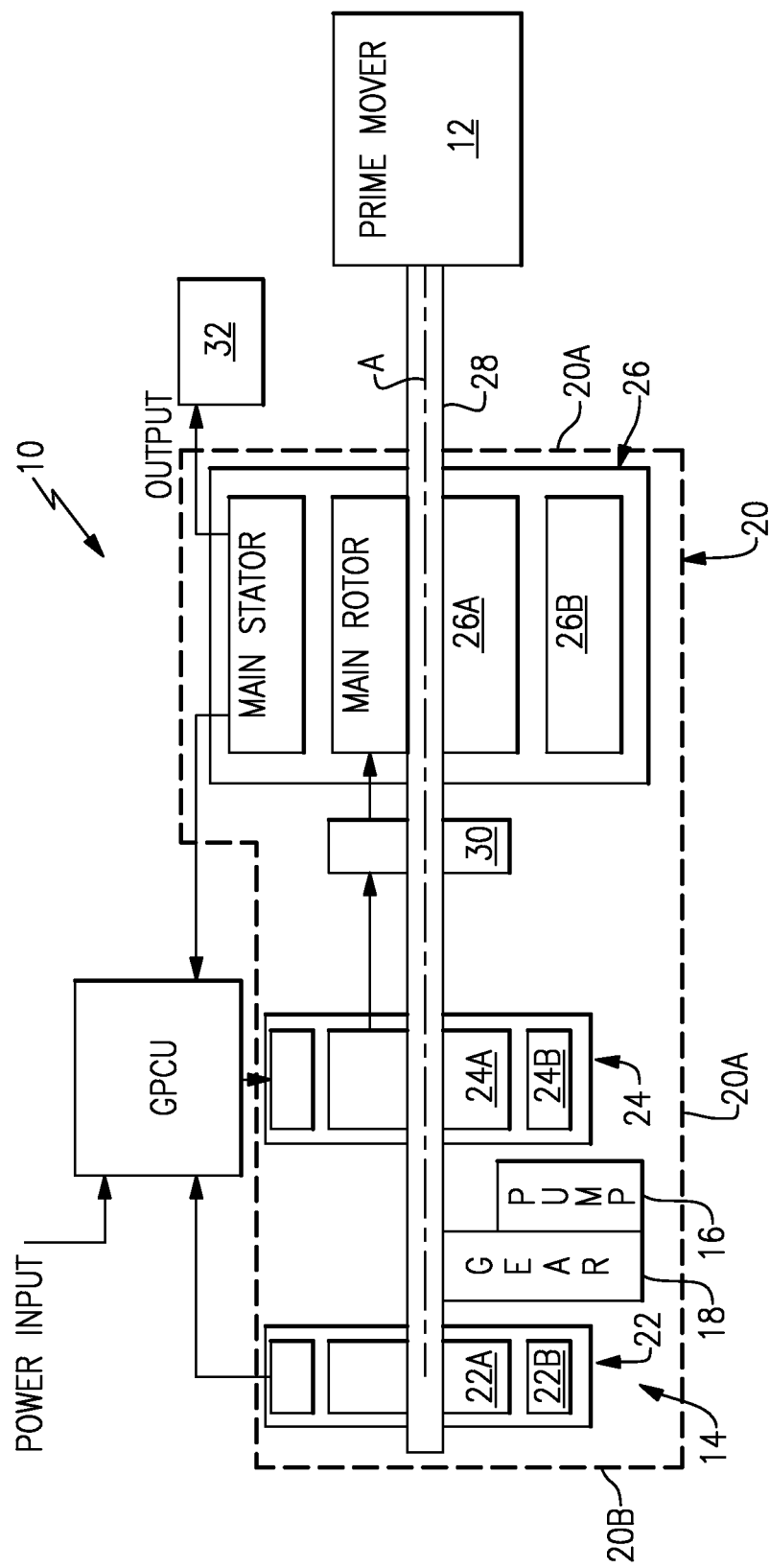
FIG. 1 is a general schematic sectional view of a generator for a gas turbine engine, for example.

FIG. 1 schematically illustrates selected portions of an example generator 10 driven by a prime mover 12, such as a gas turbine engine, and for generating electrical current when being driven by the prime mover 12. The generator 10 may generally include a dynamoelectric portion 14, hydraulic pump 16 and a gear train 18, all contained within a common housing assembly 20. Although a variable frequency generator (VFG) is illustrated in the disclosed embodiment, it should be understood that other generator systems such as an Integrated Drive Generator (IDG) will also benefit herefrom. These types of generators may be particularly well suited for aircraft applications.

The dynamoelectric portion 14 in the disclosed, non-limiting embodiment is a three-phase machine that includes three machines 22, 24 and 26 mounted on a rotor shaft 28 along an axis of rotation A. Stator assemblies 22B, 24B, 26B of the three machines are installed in the housing assembly 20 and the three rotor assemblies 22A, 24A, 26A are installed on the rotor shaft 28. The housing assembly 20 may be closed with a drive end cover assembly or housing portion 20A through which the rotor shaft 28 extends and an end plate 20B.

The first machine 22 includes a pilot exciter (PE) permanent magnet generator (PMG) with a PE rotor assembly 22A and a stator assembly 22B. The PE stator assembly 22B supplies power for generator excitation, as well as power for other components of the electrical system. The second machine 24 includes a main exciter (ME) with a ME rotor assembly 24A and a stator assembly 24B. The ME receives field excitation from the PE through a GPCU (Generator Power Control Unit). The output of the ME rotor assembly 24A is supplied to a shaft mounted diode pack 30. The diode pack 30 may be divided into six diode groups to provide a three-phase full wave bridge rectification. The DC output of the diode pack 30 supplies the third machine 26 having a rotor assembly 26A and a stator assembly 26B, which supply power to a component 32.

Figures 2, 3:
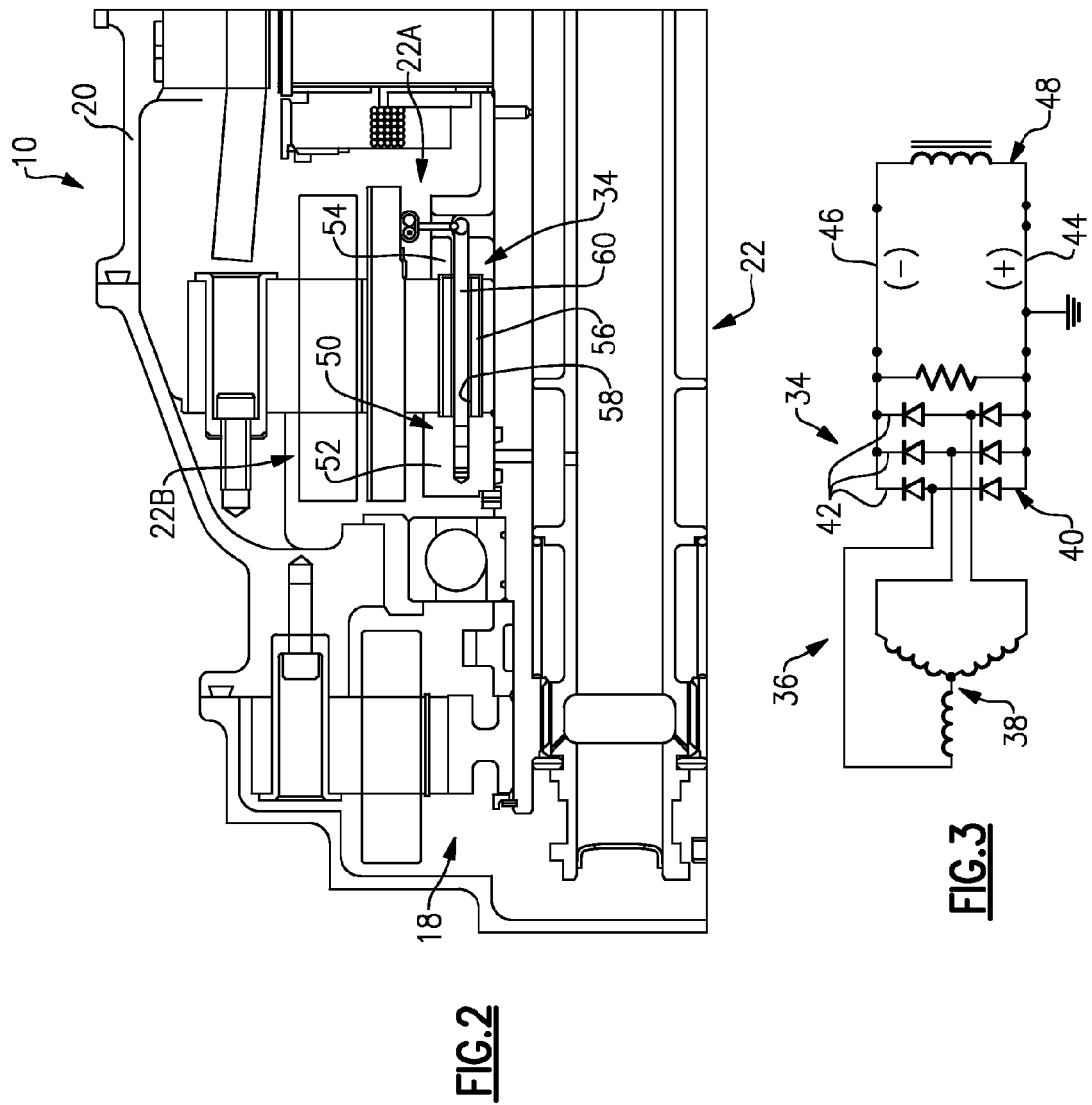
FIG. 2 is an exploded, partial cross-sectional view of a portion of the generator, including an exciter housing.
FIG. 3 is a circuit diagram of an exciter rotor for the generator shown in FIG. 1.

The PE rotor assembly 22A includes exciter rotor 34 shown in FIG. 2 and schematically illustrated in FIG. 3. With continuing reference to FIG. 3, the exciter rotor 34 includes a rotor circuit 36. Exciter armature turns 38 in the rotor circuit 36 induce an alternating current that passes through a rectifier assembly 40. Diodes 42 in the rectifier assembly 40 rectify the alternating current to provide a DC voltage. Positive and negative bus bars 44, 46 from the rectifier assembly 40 supply the DC voltage to energize main field turns 48. Rotation of the exciter rotor 34 induces an alternating current in the stator 22B.

Returning to FIG. 2 an exciter housing 50 is supported on a rotor shaft within the housing assembly 20. The exciter housing 20 houses the exciter rotor 34 and rectifier assembly 40, as shown in FIG. 3. With continuing reference to FIG. 2, the exciter housing 50 is provided by first and second portions 52, 54 that support multiple circumferentially spaced crescents 56, best shown in FIG. 4. Each crescent 56, which is conductive, includes a hole 58 receiving a fastener 60, such as a pin extending through the exciter housing 50 and the crescent 56.

Figure 4:
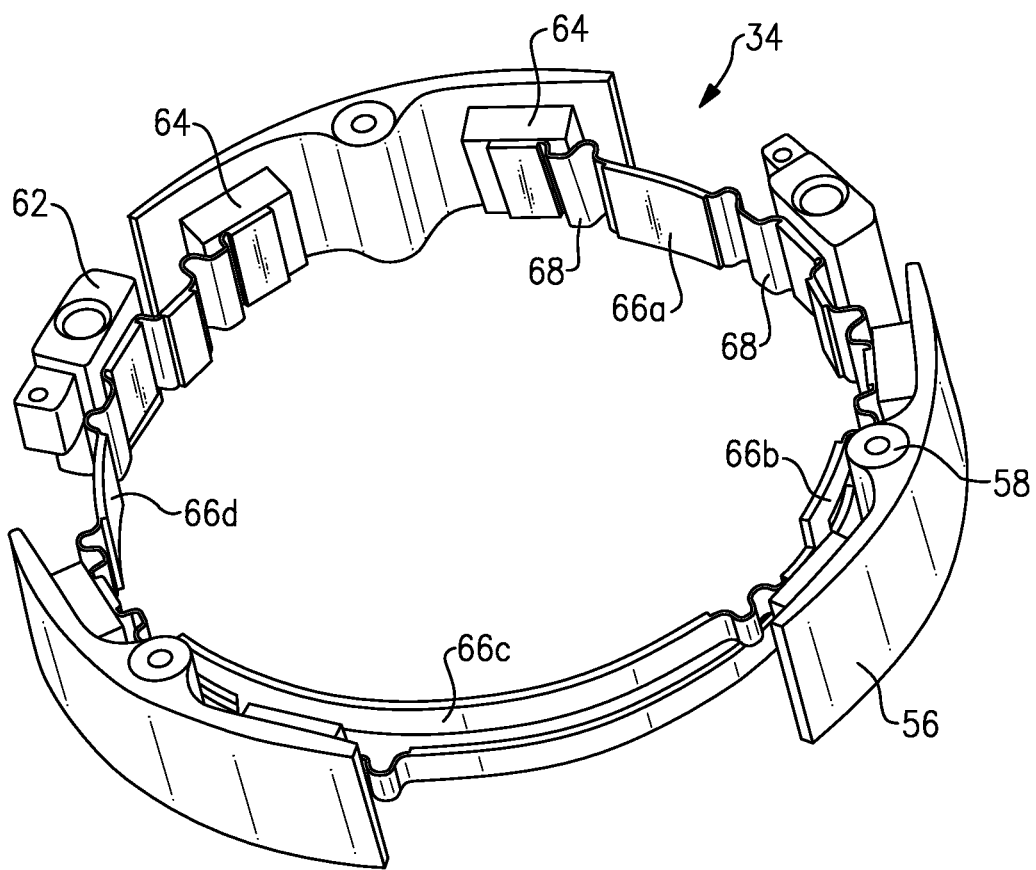
FIG. 4 is a perspective view of a rectifier assembly including crescents, diode packs and bus bars for the exciter rotor.

Referring to FIG. 4, the exciter rotor 34 may additionally include one or more standoffs 62, which are conductive, that are supported within the exciter housing 50, which is constructed from a non-conductive material. Diode packs 64 housing the diodes 42 (FIG. 3) are mounted on the crescents 56. Bus bars 66a, 66b, 66c, 66d (collectively, bus bar "66") are electrically connected to the diode packs 64 and extend circumferentially within the exciter rotor 34. A portion of one or more bus bars 66 may also be supported by the standoffs 62. The bus bars 66 provide the positive and negative bus bars 44, 46 referred to above with respect to FIG. 3.

Referring to FIGS. 4 and 5, the bus bars 66 are generally arcuate segments and may include undulations 68 to provide increased flexibility to the bus bar 66. In the example illustrated in FIG. 5, an example bus bar 66 may include an undulation 68 at each opposing end 70. The disclosed bus bar 66 may be used for other configurations, such as axially arranged diodes.

To increase the rigidity of the bus bar 66, a material stiffer than copper is used. In the FIG. 5, a first layer 74 is made of beryllium copper and a second layer 76 is made of copper. The second layer 76 provides increased electrical conductivity compared to the first layer. The first layer 74 provides the electrical and structural connections within the rectifier assembly 40. The beryllium copper has a yield strength and coefficient of thermal expansion in the range set forth in Table 1. A second layer 76 is joined to the first layer 74 and provides electrical and thermal conduction enhancements. In one example, the second layer 76 has a lesser yield strength than the first layer 74 and is within 5% of the coefficient of thermal expansion of the first layer 74. In one example, the second layer 76 is provided by copper, which has characteristics in the ranges set forth in Table 1.

TABLE 1

Example characteristics of Copper and Beryllium Copper

| | Copper | Beryllium Copper |
|---|---|---|
| Ultimate Tensile Strength | 220 Mpa | 483-810 Mpa |
| Yield Strength | 70 Mpa | 221-1172 Mpa |
| Young's Modulus | 100 Gpa | 115 Gpa |
| Poissons Ratio | 0.343 | 0.3 |
| Coefficient of Thermal Expansion | 16.4 micrometer/m-deg-C. | 16.7 micrometer/m-deg-C. |

As shown in FIGS. 5-6B, the second layer 76 may extend a length 78 that is less than the length of the first layer 74. In this manner, the portion of the bus bar 66 in most need of reinforcement has increased cooling. As shown in FIGS. 6A-6B, the first layer 74 includes a side 72 having a surface 80 to which the second layer 76 is secured. In one example, the second layer 76 may be secured to the first layer 74 by brazing or adhering with an adhesive. A second thickness 86 of the second layer 76 is lesser than a first thickness 88 of the first layer 74. In one example, the bus bar 66 includes a width 84 of 0.2 inch (5.08 mm). In one example, the thickness 86 is at least one-quarter of the thickness 88. In one example, the copper is 0.008 inch (0.20 mm) thick, and the beryllium copper is at least 0.012 inch (0.30 mm) thick.

Referring to FIGS. 7A-7B, the second layer 176 surrounds a perimeter 82 of the first layer 174 to encapsulate at least a portion of the beryllium copper layer. It should be understood that the dimensions of the bus bar 66, 166 and the configuration of its layers may vary depending upon a given application. The bus bar 166 may also be used for rotor windings.

Although an example embodiment has been disclosed, a worker of ordinary skill in this art would recognize that certain modifications would come within the scope of the claims. For that reason, the following claims should be studied to determine their true scope and content.

What is claimed is:

1. A rectifier assembly comprising:
a diode pack;
a bus bar including a first layer electrically connected to the diode pack, the first layer having a first yield strength and a first coefficient of thermal expansion, and a second layer of copper joined to and in engagement with the first layer along a length and including second yield strength less than the first yield strength, wherein the first layer is beryllium copper, wherein the second layer is either brazed or adhered to the first layer, wherein the second layer is secured to one side of the first layer, wherein the second layer surrounds a perimeter of the first layer.

2. The rectifier assembly according to claim 1, wherein the second layer has a second coefficient of thermal expansion within 5% of the first coefficient of thermal expansion.

3. The rectifier assembly according to claim 1, wherein the first and second layers respectively include first and second thicknesses, the second thickness lesser than the first thickness.

4. The rectifier assembly according to claim 3, wherein the thickness of the second layer is at least one-quarter of the thickness of the first layer.

5. The rectifier assembly according to claim 1, wherein the second layer has a length that is less than a length of the bus bar.

6. The rectifier assembly according to claim 5, wherein the first layer includes undulations on opposing ends, the length of the second layer provided between the undulations.

7. The rectifier assembly according to claim 1, comprising a crescent, wherein the diode pack is supported by the crescent.

8. The rectifier assembly according to claim 7, comprising a housing including first and second housing portions, the crescent arranged between the first and second housing portions.

9. The rectifier assembly according to claim 8, comprising a pin extending through the housing and a hole in the crescent.

10. A bus bar comprising:
a first layer electrically connected to a diode pack, the first layer having a first yield strength and a first coefficient of thermal expansion, and a second layer of copper joined to and in engagement with the first layer along a length and including second yield strength less than the first yield strength and a second coefficient of thermal expansion within 5% of the first coefficient of thermal expansion, wherein the second layer surrounds a perimeter of the first layer and arranged as a rotor winding.

11. The bus bar according to claim 10, wherein the first layer is beryllium copper.

12. The bus bar according to claim 11, wherein the second layer is either brazed or adhered to the first layer.

13. The bus bar according to claim 11, wherein the first and second layers respectively include first and second thicknesses, the first thickness greater than the second thickness, the thickness of the second layer is at least one-quarter of the thickness of the first layer.

14. The bus bar according to claim 11, wherein the second layer is secured to one side of the first layer.

15. The bus bar according to claim 11, wherein the second layer has a length that is less than a length of the bus bar, wherein the bus bar includes undulations on opposing ends, the length provided between the undulations.

* * * * *